US012707630B2

(12) United States Patent
Chae et al.

(10) Patent No.: US 12,707,630 B2
(45) Date of Patent: Aug. 11, 2026

(54) SEMICONDUCTOR DEVICE

(71) Applicant: SAMSUNG ELECTRONICS CO., LTD., Suwon-si (KR)

(72) Inventors: Jimin Chae, Suwon-si (KR); Younglim Park, Suwon-si (KR); Dongmin Shin, Suwon-si (KR); Wooseop Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 535 days.

(21) Appl. No.: 18/315,214

(22) Filed: May 10, 2023

(65) Prior Publication Data

US 2024/0032276 A1 Jan. 25, 2024

(30) Foreign Application Priority Data

Jul. 21, 2022 (KR) ........................ 10-2022-0090352

(51) Int. Cl.

| | |
|---|---|
| ***H10B 12/00*** | (2023.01) |
| ***H10B 53/30*** | (2023.01) |
| ***H10D 1/68*** | (2025.01) |

(52) U.S. Cl.

CPC ........... *H10B 12/315* (2023.02); *H10B 12/31* (2023.02); *H10B 12/312* (2023.02); *H10B 12/50* (2023.02);

(Continued)

(58) Field of Classification Search

CPC .... H10B 12/30; H10B 12/031; H10B 12/312; H10B 12/315; H10B 12/50; H10B 53/30; H10D 1/716; H10D 1/682; H10D 1/696

See application file for complete search history.

(56) References Cited

U.S. PATENT DOCUMENTS 6,489,645 B1 * 12/2002 Uchiyama .............. H10D 1/684 257/295
9,449,979 B2 * 9/2016 McKinnon ............... H10D 1/68

(Continued)

FOREIGN PATENT DOCUMENTS

CN 113130498 A * 7/2021 ............. C23C 28/00
CN 113690226 A * 11/2021 ............ H10P 14/662

(Continued)

*Primary Examiner* — Matthew E Warren

(74) *Attorney, Agent, or Firm* — Wolf, Greenfield & Sacks, P.C.

(57) ABSTRACT

A semiconductor device includes a lower structure; a plurality of lower electrodes on the lower structure; an upper electrode on the plurality of lower electrodes; a dielectric layer between the plurality of lower electrodes and the upper electrode, and including a ferroelectric layer or an antiferroelectric layer; and a plurality of interfacial layers between the plurality of lower electrodes and the dielectric layer, wherein the plurality of interfacial layers include a first layer contacting the plurality of lower electrodes, and including a first metal element, a second metal element, different from the first metal element, and elemental nitrogen; and a second layer between the first layer and the dielectric layer, and including the first metal element, the second metal element, and elemental oxygen, and wherein a concentration of the second metal element in the first layer is lower than a concentration of the second metal element in the second layer.

12 Claims, 14 Drawing Sheets

(52) U.S. Cl.
CPC ............. *H10B 53/30* (2023.02); *H10D 1/682* (2025.01); *H10D 1/696* (2025.01); *H10D 1/716* (2025.01)

(56) References Cited

U.S. PATENT DOCUMENTS

| | | | | |
|---|---|---|---|---|
| 2020/0105633 | A1 | 4/2020 | Lee et al. | |
| 2020/0286985 | A1 | 9/2020 | Lim et al. | |
| 2020/0395438 | A1 | 12/2020 | Kang et al. | |
| 2021/0066066 | A1 | 3/2021 | Lee et al. | |
| 2021/0134804 | A1 | 5/2021 | Jung et al. | |
| 2021/0202693 | A1 | 7/2021 | Kang et al. | |
| 2023/0225112 | A1 | 7/2023 | Park et al. | |
| 2023/0290814 | A1* | 9/2023 | Kim | H10B 12/033 |
| 2023/0320075 | A1* | 10/2023 | Park | H10D 1/696<br>257/296 |
| 2023/0363135 | A1* | 11/2023 | Chae | H10B 12/033 |
| 2023/0402503 | A1* | 12/2023 | Park | H10D 1/716 |

FOREIGN PATENT DOCUMENTS

| | | | | | |
|---|---|---|---|---|---|
| KR | 20200141809 | A | | 12/2020 | |
| KR | 10-2021-0053378 | A | | 5/2021 | |
| KR | 20210053379 | A | | 5/2021 | |
| KR | 10-2022-0014997 | A | | 2/2022 | |
| KR | 20230106849 | A | | 7/2023 | |
| KR | 20230163233 | A | * | 11/2023 | H10D 1/696 |
| WO | WO-2023115547 | A1 | * | 6/2023 | H10D 64/683 |

* cited by examiner

SEMICONDUCTOR DEVICE

CROSS-REFERENCE TO RELATED APPLICATION(S)

This application claims benefit of priority to Korean Patent Application No. 10-2022-0090352 filed on Jul. 21, 2022 in the Korean Intellectual Property Office, the disclosure of which is incorporated herein by reference in its entirety.

BACKGROUND

The present inventive concept relates to a semiconductor device.

According to the development of the electronics industry and the needs of users, electronic devices are becoming smaller in size and higher in performance. Accordingly, semiconductor devices used in electronic devices are also required to have a high degree of integration and high performance. In a DRAM memory device, a technology for forming a capacitor having improved electrical characteristics with a high degree of integration is required.

SUMMARY

An aspect of the present inventive concept is to provide a semiconductor device having improved electrical characteristics and a high degree of integration.

According to an aspect of the present inventive concept, a semiconductor device includes a lower structure; a plurality of lower electrodes on the lower structure; an upper electrode on the plurality of lower electrodes; a dielectric layer between the plurality of lower electrodes and the upper electrode, and including a ferroelectric layer or an antiferroelectric layer; and a plurality of interfacial layers between the plurality of lower electrodes and the dielectric layer, wherein the plurality of interfacial layers includes a first layer contacting the plurality of lower electrodes, and including a first metal element, a second metal element, different from the first metal element, and elemental nitrogen; and a second layer between the first layer and the dielectric layer, and including the first metal element, the second metal element, and elemental oxygen, and wherein a concentration of the second metal element in the first layer is lower than a concentration of the second metal element in the second layer.

According to an aspect of the present inventive concept, a semiconductor device includes a lower structure including a transistor; and an upper structure on the lower structure, and the upper structure includes a support layer and a capacitor structure electrically connected to the transistor, wherein the capacitor structure includes a lower electrode on the lower structure, the lower electrode is electrically connected to the transistor; an upper electrode on the lower electrode; a dielectric layer between the lower electrode and the upper electrode, and including a ferroelectric layer or an antiferroelectric layer; and a plurality of interfacial layers between the lower electrode and the dielectric layer, wherein the support layer is in contact with the lower electrode and extends in a direction, parallel to an upper surface of the lower structure, wherein the dielectric layer extends between the upper electrode and the support layer, wherein the plurality of interfacial layers includes a first layer contacting the lower electrode, and including a first metal element, a second metal element different from the first metal element, and elemental nitrogen; and a second layer between the first layer and the dielectric layer, and including the first metal element, the second metal element, and elemental oxygen, wherein a concentration of the first metal element in the first layer is higher than a concentration of the first metal element in the second layer, and wherein a concentration of the second metal element in the first layer is lower than a concentration of the second metal element in the second layer.

According to an aspect of the present inventive concept, a semiconductor device includes a lower structure including a transistor; and an upper structure on the lower structure, and including an etch stop layer and a capacitor structure electrically connected to the transistor, wherein the capacitor structure includes a plurality of lower electrodes passing through the etch stop layer, electrically connected to the transistor, and physically spaced apart from each other; an upper electrode on the plurality of lower electrodes on the lower structure; a dielectric layer between the plurality of lower electrodes and the upper electrode, and including a ferroelectric layer or an antiferroelectric layer; and a plurality of interfacial layers between the plurality of lower electrodes and the dielectric layer, wherein the plurality of interfacial layers includes a first layer contacting the plurality of lower electrodes, and including a first metal element, a second metal element different from the first metal element, and elemental nitrogen; and a second layer between the first layer and the dielectric layer, and including the first metal element, the second metal element, and elemental oxygen, wherein the first layer is free of having an overlap with the etch stop layer in a vertical direction perpendicular to an upper surface of the lower structure, and wherein the second layer overlaps the etch stop layer in the vertical direction.

BRIEF DESCRIPTION OF DRAWINGS

The above and other aspects, features, and advantages of the present inventive concept will be more clearly understood from the following detailed description, taken in conjunction with the accompanying drawings, in which:

FIG. 8 illustrates cross-sections of the semiconductor device of FIG. 7, taken along lines II-IF and

DETAILED DESCRIPTION

Hereinafter, embodiments of the present inventive concept will be described with reference to the accompanying drawings.

Figure 1:
FIG. 1 is a schematic plan view of a semiconductor device according to example embodiments.
Figure 1:
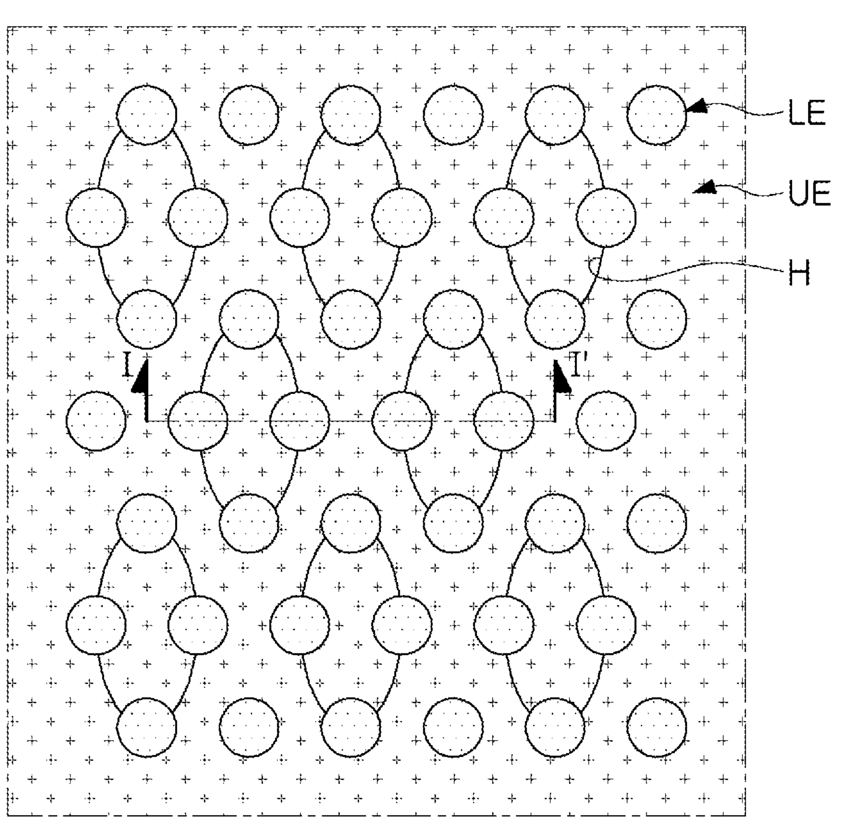
Figure 1:
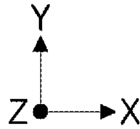

FIG. 1 is a schematic plan view of a semiconductor device according to example embodiments.

Figure 2:
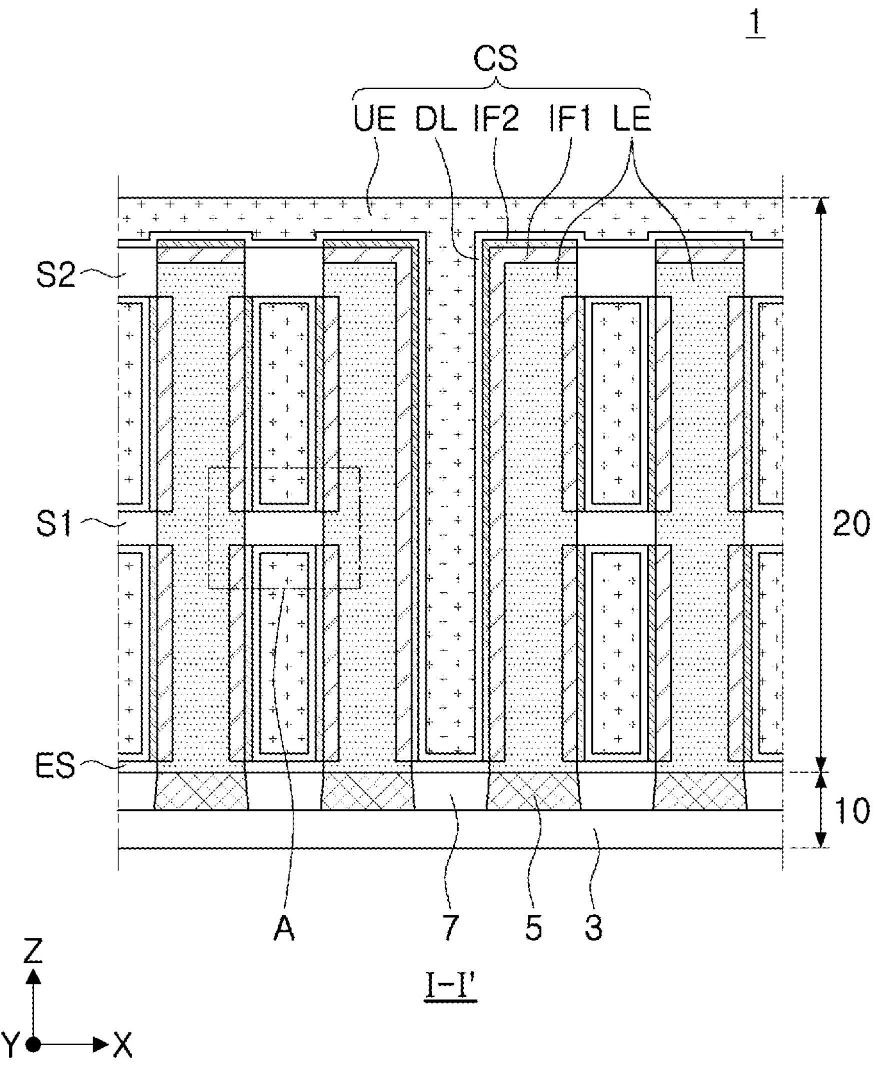
FIG. 2 is a schematic cross-sectional view of a semiconductor device according to example embodiments.

FIG. 2 is a schematic cross-sectional view of a semiconductor device according to example embodiments. FIG. 2 illustrates a cross-section of the semiconductor device of FIG. 1, taken along line I-I'.

Figure 3:
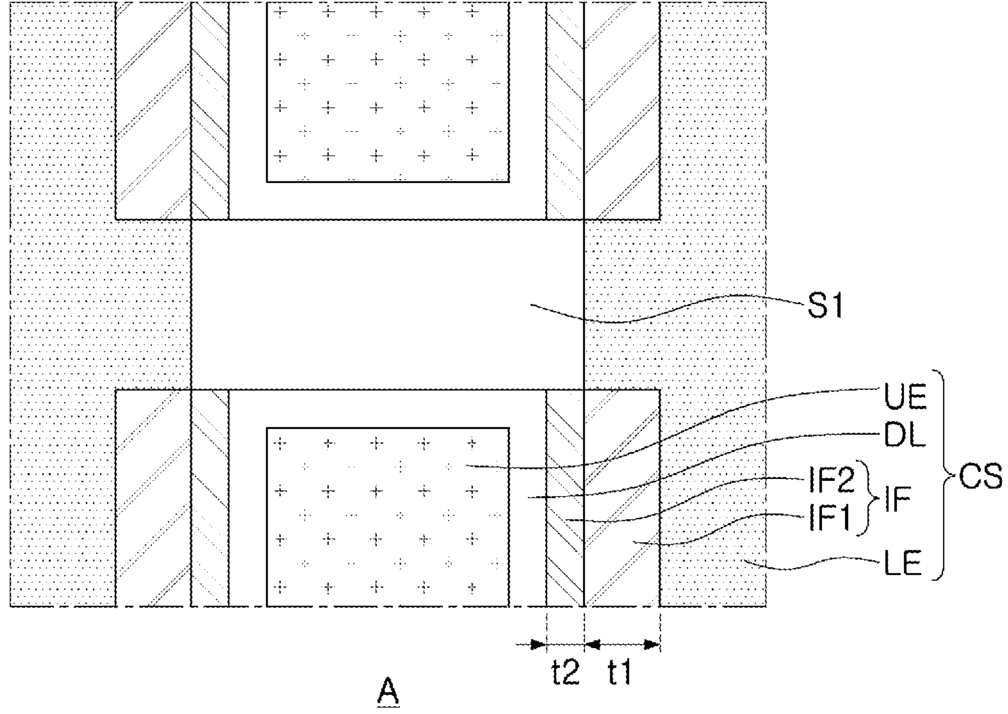
FIG. 3 is a partially enlarged cross-sectional view of a semiconductor device according to example embodiments.

FIG. 3 is a partially enlarged cross-sectional view of a semiconductor device according to example embodiments. FIG. 3 illustrates a partially enlarged cross-section corresponding to portion 'A' of FIG. 2.

Figure 4A:
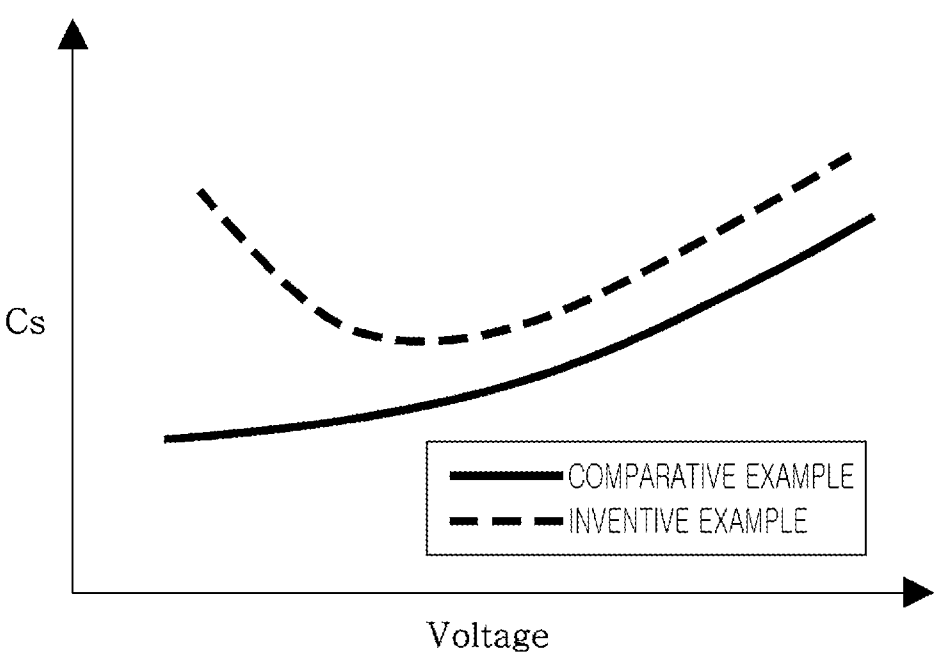
FIGS. 4A and 4B are graphs illustrating characteristics of a dielectric layer of a semiconductor device according to example embodiments.
Figure 4B:
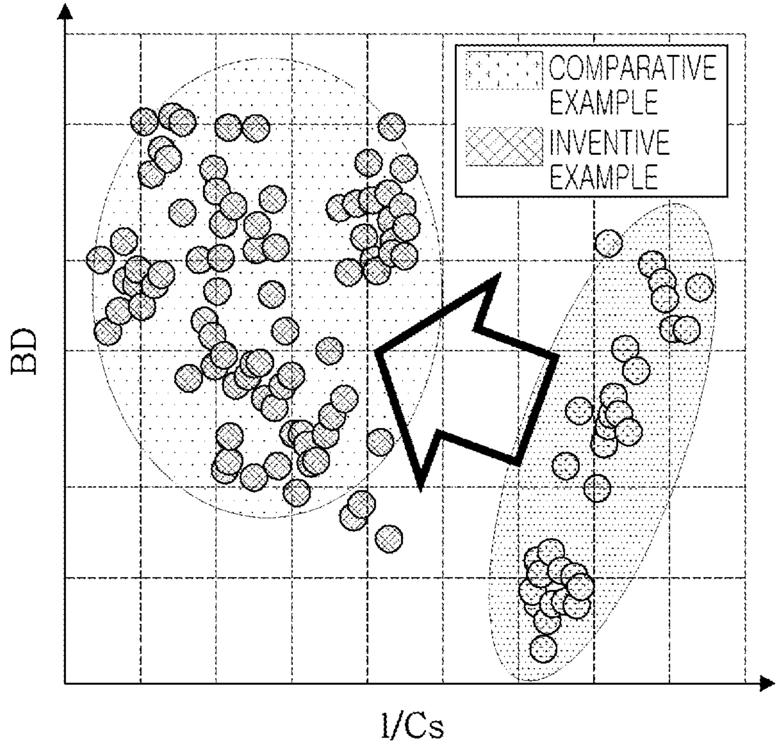

FIGS. 4A and 4B are graphs illustrating characteristics of a dielectric layer of a semiconductor device according to example embodiments.

Referring to FIGS. 1 to 4B, a semiconductor device 1 may include a lower structure 10 including transistors, and an upper structure 20 disposed on the lower structure 10 and including information storage structures. The semiconductor device 1 may be an assembly of a memory device including one transistor among the transistors and one information storage structure among the information storage structures, but the number of transistors and the number of information storage structures constituting the memory device are not limited thereto. The memory device may be a dynamic random access memory (DRAM) or a ferroelectric memory (FeRAM), but the present inventive concept is not limited thereto.

The lower structure 10 may include a circuit structure 3 including the transistors, landing pads 5 electrically connected to the circuit structure 3 on the circuit structure 3, and a lower insulating layer 7 on (covering) side surfaces of the landing pads 5 on the circuit structure 3. On a plane, the landing pads 5 may be arranged in the same or similar positions as lower electrodes LE, as illustrated in FIG. 1. The landing pads 5 may include at least one of a semiconductor material such as polycrystalline silicon or the like, a metal-semiconductor compound, a metal nitride, or a metal.

The upper structure 20 may include an etch stop layer ES, a capacitor structure CS, and at least one support layer (S1 and S2), on the lower structure 10.

The etch stop layer ES may be disposed on the lower structure 10, and may have a substantially uniform thickness. The etch stop layer ES may be disposed on (cover) at least a portion of the lower structure 10 and may expose upper surfaces of the landing pads 5. The etch stop layer ES may include an insulating material, for example, at least one of silicon oxide, silicon nitride, or silicon oxynitride.

The capacitor structure CS may include a plurality of lower electrodes LE, a dielectric layer DL, a plurality of interfacial layers IF, and an upper electrode UE.

The plurality of lower electrodes LE may be physically spaced apart from each other in a horizontal direction. On a plane, the plurality of lower electrodes LE may be arranged in a zigzag pattern. The plurality of lower electrodes LE may have a pillar shape or a cylindrical shape, but the present inventive concept is not limited thereto. Each of the plurality of lower electrodes LE may pass through the etch stop layer ES to be electrically connected to each of the landing pads 5.

The plurality of lower electrodes LE may include a conductive material. The conductive material may include at least one of a semiconductor material such as polycrystalline silicon doped with impurities, a metal nitride such as titanium nitride (TiN) or the like, a metal material such as titanium (Ti), cobalt (Co), nickel (Ni), tungsten (W), molybdenum (Mo), or the like. The conductive material may include, for example, titanium nitride (TiN).

The at least one support layer (S1 and S2) may be disposed in the capacitor structure CS. The at least one support layer (S1 and S2) may be disposed to be spaced apart from each other in a Z direction, perpendicular to an upper surface of the lower structure 10, and may extend in a horizontal direction, perpendicular to the Z direction. The at least one support layer (S1 and S2) may be in contact with the plurality of lower electrodes LE, and may connect sidewalls of a plurality of adjacent lower electrodes LE. Upper and lower surfaces of the at least one support layer (S1 and S2) may be in contact with the dielectric layer DL. The at least one support layer (S1 and S2) may be a structure supporting the plurality of lower electrodes LE having a high aspect ratio.

The at least one support layer (S1 and S2) may include an insulating material. The insulating material may include at least one of silicon oxide, silicon nitride, or silicon oxynitride. The insulating material may include, for example, silicon nitride (SiN).

In an example embodiment, the at least one support layer (S1, S2) may include a first support layer S1 and a second support layer S2 disposed on the first support layer S1, sequentially stacked. The first support layer S1 may have a thickness, smaller than a thickness of the second support layer S2. A distance between the lower structure 10 and a lower surface of the first support layer S1 may be greater than a distance between an upper surface of the first support layer S1 and a lower surface of the second support layer S2. The number, thicknesses, and arrangement relationships of the support layers are not limited thereto, and may be variously changed.

The dielectric layer DL may be disposed on (cover) the etch stop layer ES, the plurality of lower electrodes LE, and the at least one support layer (S1 and S2) on the lower structure 10. The dielectric layer DL may be conformally disposed on (cover) upper and side surfaces of the plurality of lower electrodes LE, an upper surface of the etch stop layer ES, and exposed surfaces of the at least one support layer (S1 and S2). The dielectric layer DL may extend between the upper electrode UE and the at least one support layer (S1 and S2). In an example embodiment, upper and lower surfaces of each of the at least one support layer (S1 and S2) may be in contact with the dielectric layer DL. The upper and lower surfaces of each of the one support layer (S1 and S2) may not be in contact with a first layer IF1. The dielectric layer DL may extend between the upper electrode UE and the etch stop layer ES. In an example embodiment, the upper surface of the etch stop layer ES may be in contact with the dielectric layer DL. The upper surface of the etch stop layer ES may not be in contact with the first layer IF1.

In an example embodiment, the dielectric layer DL may include an oxide, a nitride, a silicide, an oxynitride, or a silicified oxynitride, including at least one of hafnium (Hf), aluminum (Al), zirconium (Zr), or lanthanum (La).

In an example embodiment, the dielectric layer DL may include at least one of a ferroelectric layer or an antiferroelectric layer. Therefore, the dielectric layer DL may have an orthorhombic phase or a tetragonal phase.

In an example embodiment, the dielectric layer DL may include an Hf-based compound, a Zr-based compound, and/or an Hf—Zr-based compound. For example, the Hf-based compound may be an HfO-based ferroelectric material or an HfO-based antiferroelectric material, the Zr-based compound may include a ZrO-based ferroelectric material or a ZrO-based antiferroelectric material, and the Hf—Zr-based compound may include a hafnium zirconium oxide (HZO)-based ferroelectric material or an HZO-based anti-ferroelectric material.

The dielectric layer DL may include a ferroelectric material doped with an impurity, such as at least one of C, Si, Mg, Al, Y, N, Ge, Sn, Gd, La, Sc, or Sr. For example, the ferroelectric layer of the dielectric layer DL may be formed of a material in which an impurity, such as at least one of C, Si, Mg, Al, Y, N, Ge, Sn, Gd, La, Sc, or Sr is doped into at least one of $HfO_2$, $ZrO_2$, or HZO.

The upper electrode UE may have a structure that is disposed on (covering) the plurality of lower electrodes LE, the at least one support layer (S1 and S2), and the dielectric layer DL. The upper electrode UE may have a structure filling a space between the plurality of lower electrodes LE and a space between the at least one support layer (S1 and S2).

The upper electrode UE may include a conductive material. The conductive material may include at least one of a semiconductor material such as polycrystalline silicon or the like doped with impurities, a metal nitride such as titanium nitride (TiN) or the like, or a metal material such as titanium (Ti), cobalt (Co), nickel (Ni), tungsten (W), molybdenum (Mo), or the like.

The plurality of interfacial layers IF may be disposed between the plurality of lower electrodes LE and the dielectric layer DL. The plurality of interfacial layers IF may be structures for improving capacitance of the capacitor structure CS. The plurality of interfacial layers IF may not extend onto upper and lower surfaces of each of the at least one support layer (S1 and S2). Also, the plurality of interfacial layers IF may not extend onto an upper surface of the etch stop layer ES. For example, the plurality of interfacial layers IF may be physically spaced apart from each other on the plurality of adjacent lower electrodes LE, and may electrically separate a plurality of adjacent lower electrodes LE. Therefore, a bridge disturbance (BD) phenomenon such as a flow of a leakage current between the plurality of lower electrodes LE or the like may be suppressed.

In an example embodiment, the plurality of interfacial layers IF may include a first layer IF1 and a second layer IF2. The number of layers forming the plurality of interfacial layers IF may be variously changed according to embodiments.

The first layer IF1 may be disposed on at least a portion (e.g., a portion not in contact with the at least one support layer (S1 and S2)) of side surfaces of the plurality of lower electrodes LE and/or on upper surfaces of the plurality of lower electrodes LE.

The first layer IF1 may include a first metal element, a second metal element different from the first metal element, and elemental nitrogen. Each of the first metal element and the second metal element may be one of tin (Sn), molybdenum (Mo), niobium (Nb), tantalum (Ta), titanium (Ti), indium (In), nickel (Ni), cobalt (Co)), tungsten (W), or ruthenium (Ru). The first metal element may be a metal element constituting the plurality of lower electrodes LE, but the present inventive concept is not limited thereto. For example, the first metal element may be titanium (Ti), and the second metal element may be niobium (Nb).

The second layer IF2 may be disposed between the first layer IF1 and the dielectric layer DL.

The second layer IF2 may include the first metal element, the second metal element, and elemental oxygen.

A concentration of the first metal element in the first layer IF1 may be higher than a concentration of the first metal element in the second layer IF2. A concentration of the second metal element in the first layer IF1 may be lower than a concentration of the second metal element in the second layer IF2. In this case, this may be because the first and second layers IF1 and IF2 are diffusion layers formed by sequentially depositing a first preliminary layer L1 (refer to FIG. 6C) including the first metal element and a second preliminary layer L2 (refer to FIG. 6C) including the second metal element on the plurality of lower electrodes LE, and performing a heat treatment process thereon.

The first preliminary layer L1 may include a material having an etch rate, higher than that of the second preliminary layer L2 under specific etching conditions. For example, the first preliminary layer L1 may include TiO, and the second preliminary layer L2 may include NbO. Also, the first layer IF1 may be, for example, TiNbN, and the second layer IF2 may be, for example, TiNbO.

The second layer IF2 may be a layer formed by diffusing the first metal element of the first preliminary layer L1 into the second preliminary layer L2 by the heat treatment process. The second layer IF2 may include a material having an etch rate, higher than that of the second preliminary layer L2 under a specific etching condition. Therefore, in a subsequent etching process, an interfacial layer disposed on the upper and lower surfaces of each of the at least one support layer (S1 and S2) or on the upper surface of the etch stop layer ES may be selectively removed. Therefore, the semiconductor device 1 having improved electrical characteristics by suppressing a leakage current between the plurality of lower electrodes LE may be provided.

FIG. 4A is a graph illustrating a magnitude of capacitance Cs of a capacitor according to an applied voltage V, and FIG. 4B is a graph illustrating a correlation between a reciprocal number of capacitance (1/Cs) and a bridge disturbance (BD) failure rate such as a leakage current or the like.

Referring to FIG. 4A, with respect to a comparative example relating to a dielectric layer including a paraelectric material, it can be seen that capacitance Cs increases as an applied voltage V increases. With respect to an inventive example relating to a dielectric layer including a ferroelectric or an antiferroelectric material, it can be seen that there may be one section in which capacitance Cs decreases and another section in which the capacitance Cs increases, as an applied voltage V increases.

Therefore, in a semiconductor device having a dielectric layer DL including a ferroelectric or antiferroelectric material, it is necessary to finely control an applied voltage V by minimizing a leakage current. In a semiconductor device 1, according to example embodiments, capacitance Cs between a plurality of lower electrodes LE and the dielectric layer DL may be improved by the plurality of interfacial layers IF therebetween, or a leakage current may be reduced (prevented) by efficiently removing interfacial layers on the at least one support layer (S1 and S2) or the etch stop layer ES. Therefore, a semiconductor device 1 having improved electrical characteristics may be provided.

Referring to FIG. 4B, it can be seen that as capacitance Cs increases, an occurrence rate of BD defects in a dielectric layer including a ferroelectric or an antiferroelectric material increases, as compared to an occurrence rate of BD defects in a dielectric layer including a paraelectric material.

For example, in a semiconductor device 1 having a dielectric layer DL including a ferroelectric or an antiferroelectric material according to the present embodiments, an occurrence rate of BD defects may be relatively high. Therefore, it is necessary to minimize dummy interfacial layers on at least one support layer (S1 and S2) or an etch stop layer ES. In the semiconductor device 1 according to the present embodiments, as a plurality of interfacial layers IF are formed by a heat treatment process, the dummy interfacial layers formed on the at least one support layer (S1 and S2) or the etch stop layer ES may be removed to provide a semiconductor device 1 having an improved (reduced) occurrence rate of BD defects.

In an example embodiment, a first thickness t1 of a first layer IF1 may be thicker than a second thickness t2 of a second layer IF2. For example, the first thickness t1 may be in a range of about 1 angstrom (Å) to 20 Å, and the second thickness t2 may be in a range of about 1 Å to 10 Å. This may be because the first layer IF1 is formed by diffusing a portion of the first metal element or a portion of the second metal element into a plurality of lower electrodes LE by a heat treatment process. In an etching process performed after the heat treatment process (e.g., an etching process for removing the dummy interfacial layers formed on the at least one support layer (S1 and S2) or the etch stop layer ES), the second layer IF2 may be also partially removed. Therefore, the second thickness t2 of the second layer IF2 may be thinner than the first thickness t1 of the first layer IF1.

In an example embodiment, the first layer IF1 may not overlap the at least one support layer (S1 and S2) and/or the etch stop layer ES in the vertical direction Z, and the second layer IF2 may overlap the at least one support layer (S1 and S2) and/or the etch stop layer ES in the vertical direction Z. In each of the plurality of lower electrodes LE, a width on a level on which the at least one support layer (S1 and S2) is disposed or a width on a level on which the etch stop layer ES is disposed may be wider than a width on the other level. This may be because the first layer IF1 is a layer formed by diffusing a portion of the first metal element or a portion of the second metal element into the plurality of lower electrodes LE.

FIGS. 5A to 5E are schematic partial enlarged views of a semiconductor device according to example embodiments. FIGS. 5A to 5E are partially enlarged views illustrating a region corresponding to portion 'A' of FIG. 2.

Figure 5A:
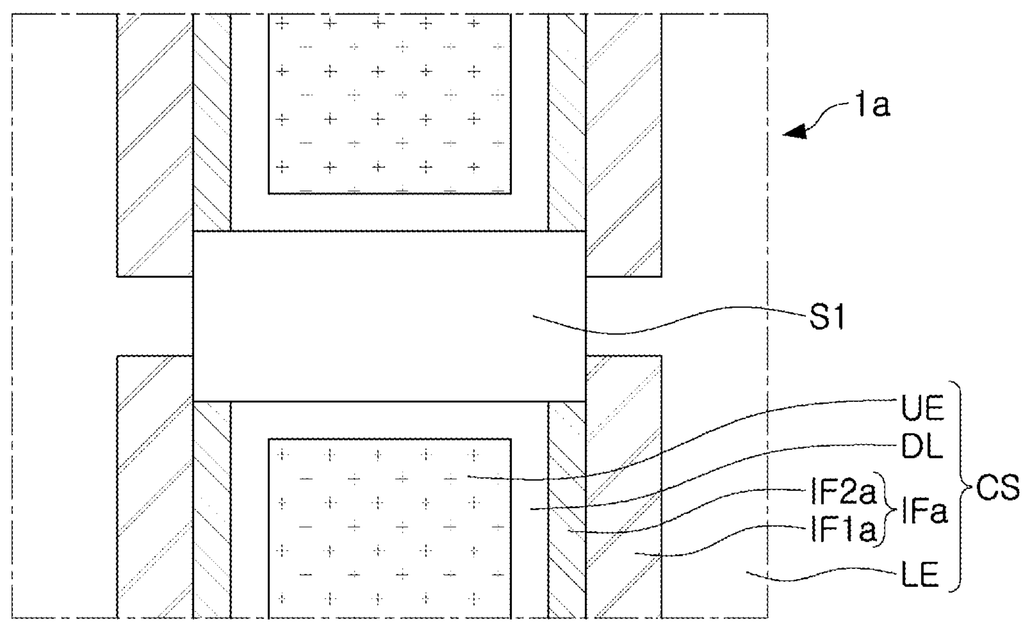
FIGS. 5A to 5E are schematic partial enlarged views of a semiconductor device according to example embodiments.

Referring to FIG. 5A, in a semiconductor device 1*a*, a length of a first layer IF1*a* may be different from a length of a second layer IF2*a*, in the vertical direction Z. The first layer IF1*a* may be disposed on (cover) a portion of a side surface of at least one support layer (S1 and S2). For example, the first layer IF1*a* may extend from a side surface of the second layer IF2*a* to cover at least a portion of the side surface of the at least one support layer (S1 and S2). The first layer IF1*a* may have a structure extending into one region of a plurality of lower electrodes LE covering the side surface of the at least one support layer (S1 and S2), as compared to FIG. 3. This may be because the first layer IF1*a* is a diffusion layer formed by a heat treatment process.

Figure 5B:
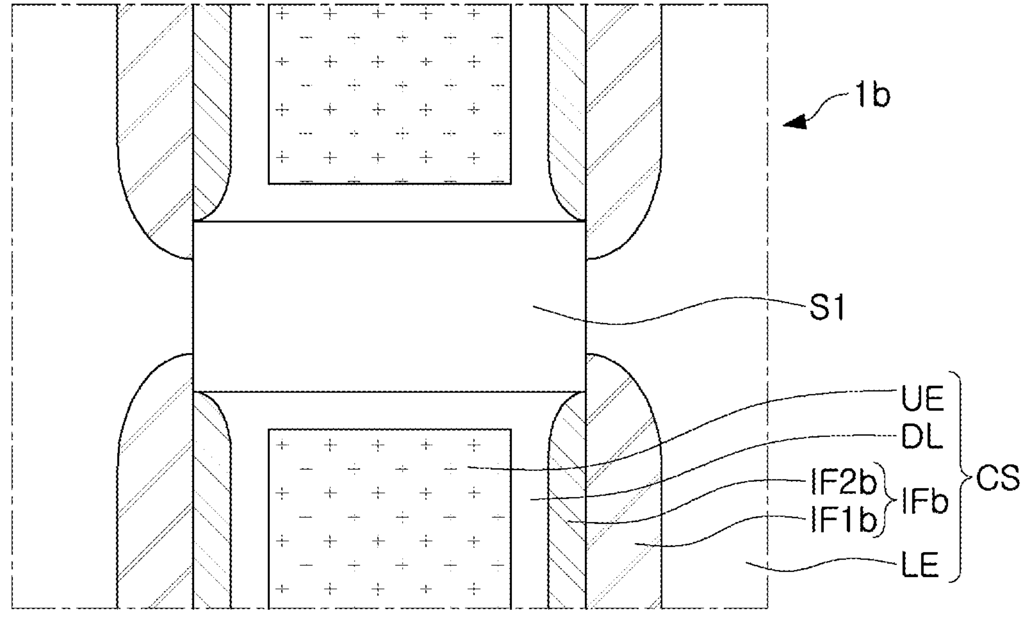

Referring to FIG. 5B, in a semiconductor device 1*b*, a first layer IF1*b* and a second layer IF2*b* may include a portion of which width decreases, respectively, toward at least one support layer (S1 and S2) or an etch stop layer ES.

In an example embodiment, the portion in which the width of the first layer IF1*b* decreases may have a convex shape, in a direction from the second layer IF2*b* toward a plurality of lower electrodes LE.

In an example embodiment, the portion in which the width of the second layer IF2*b* decreases may have a convex shape, in a direction from the first layer IF1*b* toward a dielectric layer DL.

This may be because the portion in which the width of the first layer IF1*b* decreases is a structure due to diffusion, and the portion in which the width of the second layer IF2*b* decreases is a structure caused by an etching process.

Figure 5C:
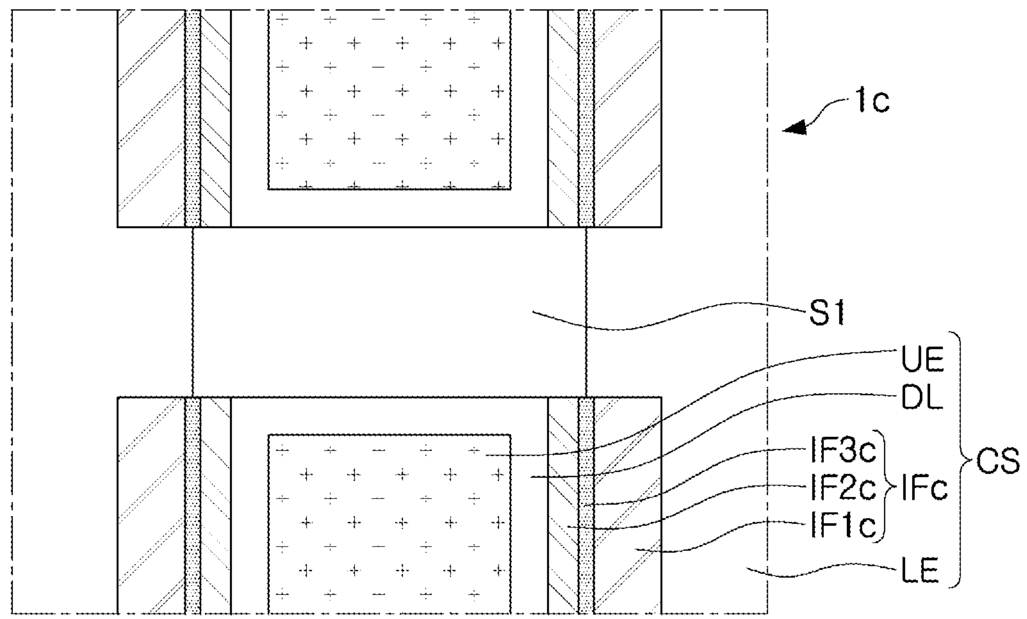

Referring to FIG. 5C, in a semiconductor device 1*c*, a plurality of interfacial layers IFc may further include a third layer IF3*c* disposed between a first layer IF1*c* and a second layer IF2*c*.

The third layer IF3*c* may be an interfacial layer formed by diffusion of elements of the first layer IF1*c* and the second layer IF2*c*. Therefore, the third layer IF3*c* may include both elements of the first layer IF1*c* and the second layer IF2*c*. In an example embodiment, the third layer IF3*c* may include the first metal element, the second metal element, elemental oxygen, and elemental nitrogen. The third layer IF3*c* may be, for example, TiNbON.

The third layer IF3*c* may have a smaller thickness than the first layer IF1*c* or the second layer IF2*c*.

In an example embodiment, at least a portion of the third layer IF3*c* may overlap at least one support layer (S1 and S2) or an etch stop layer ES in the vertical direction Z. For example, the third layer IF3*c* may overlap side surfaces of the at least one support layer (S1 and S2) or side surfaces of the etch stop layer ES in the vertical direction Z, to include a portion extending between the first layer IF1*c* and the second layer IF2*c*.

Figure 5D:
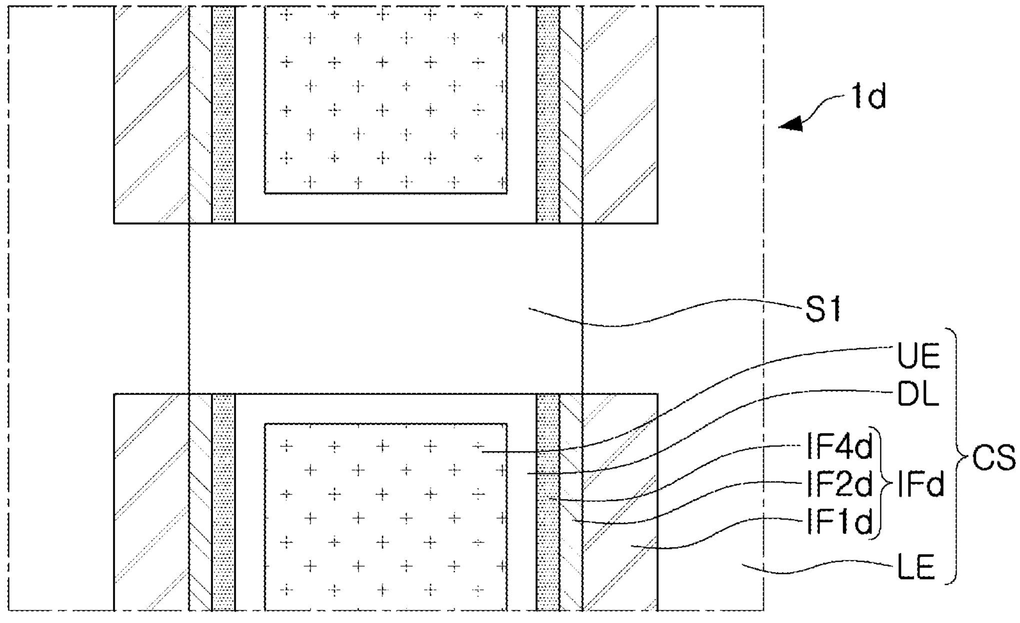

Referring to FIG. 5D, in a semiconductor device 1*d*, a plurality of interfacial layers IFd may further include a fourth layer IF4*d* disposed between a second layer IF2*d* and a dielectric layer DL.

A first layer IF1*d* may include a third metal element, different from the first metal element and the second metal element, together with the first metal element and the second metal element.

The second layer IF2*d* may also include the first metal element, the second metal element, and the third metal element.

The fourth layer IF4*d* may include the third metal element, and a concentration of the third metal element in the fourth layer IF4*d* may be higher than a concentration of the third metal element in the second layer IF2*d*. Also, a concentration of the third metal element in the second layer IF2*d* may be higher than a concentration of the third metal element in the first layer IF1*d*. This may be because a heat treatment process is performed after additionally depositing a separate preliminary layer having the third metal element different from first and second preliminary layers L1 and L2 (refer to FIG. 6C). A material type of the separate preliminary layer or the fourth layer IF4*d* may be controlled to efficiently remove dummy interfacial layers remaining on at least one support layer (S1 and S2) or an etch stop layer ES, to provide a semiconductor device having improved electrical characteristics.

Figure 5E:
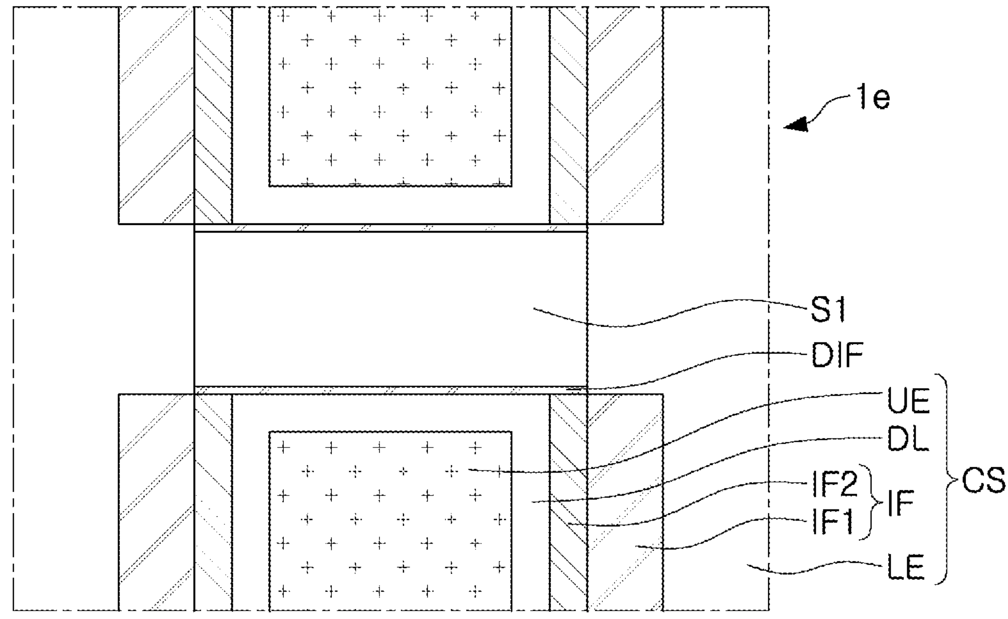

Referring to FIG. 5E, a semiconductor device 1*e* may further include a dummy interfacial layer DIF.

The dummy interfacial layer DIF may be disposed between at least one support layer (S1 and S2) and a dielectric layer DL. The dummy interfacial layer DIF may be in contact with upper and lower surfaces of the at least one support layer (S1 and S2). In an example embodiment, the dummy interfacial layer DIF may also be disposed between an etch stop layer ES and the dielectric layer DL. In this case, the dummy interfacial layer DIF may be in contact with an upper surface of the etch stop layer ES.

The dummy interfacial layer DIF may include the first metal element and/or the second metal element in a plurality of interfacial layers IF. The dummy interfacial layer DIF may be a diffusion layer extending into the at least one support layer (S1 and S2) that is formed during a deposition process, a heat treatment process, and a subsequent etching process of first and second preliminary layers L1 and L2, or may be a diffusion layer formed by a material of the at least one support layer (S1 and S2) extending into the first and second preliminary layers L1 and L2.

A concentration of the first metal element in the plurality of interfacial layers IF may be higher than a concentration of the first metal element in the dummy interfacial layer DIF, and a concentration of the second metal element in the plurality of interfacial layers IF may be higher than a concentration of the second metal element in the dummy interfacial layer DIF. In an example embodiment, a ratio of an amount of the second metal element per unit in the plurality of interfacial layers IF relative to an amount of the second metal element per unit in the dummy interfacial layer DIF may be about 1000 to about 10000 (or more). For example, the concentration of the second metal element in the plurality of interfacial layers IF may be about 1000 times to about 10000 times or more of the concentration of the second metal element in the dummy interfacial layer DIF. In this specification, the concentration of the second metal element in the plurality of interfacial layers IF may mean an average value of concentrations of the second metal element in a first layer IF1 and a second layer IF2.

In an example embodiment, a thickness of the dummy interfacial layer DIF may be thinner than a thickness of the second layer IF2.

FIGS. 6A to 6E are cross-sectional views illustrating a method of manufacturing a semiconductor device according to example embodiments. FIGS. 6A to 6E correspond to cross-sectional views of the semiconductor device of FIG. 1, taken along line I-I'.

Figure 6A:
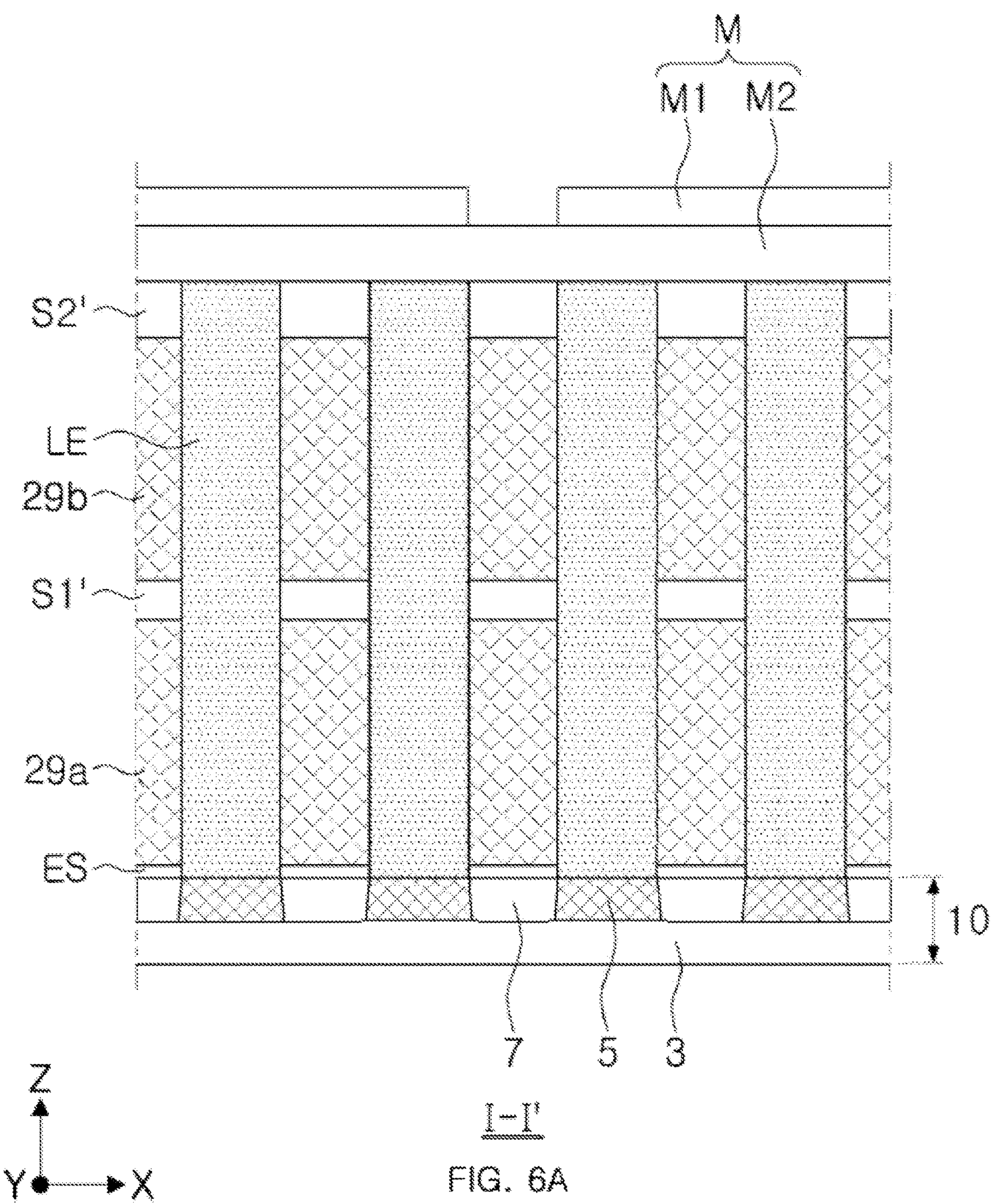
FIGS. 6A to 6E are cross-sectional views illustrating a method of manufacturing a semiconductor device according to example embodiments.

Referring to FIG. 6A, a lower structure 10 may be formed, mold layers 29*a* and 29*b* and preliminary support layers S1' and S2' may be alternately stacked on the lower structure 10, and a plurality of lower electrodes LE passing through the mold layers 29*a* and 29*b* and the preliminary support layers Si' and S2' may be formed.

First, active regions (refer to 102 in FIGS. 7 and 8) may be formed on a semiconductor substrate (refer to 101 in FIG. 8), a word line structure (refer to WLS in FIGS. 7 and 8) may be formed in trenches formed by removing a portion of the semiconductor substrate, and a bit line structure (refer to BLS in FIGS. 7 and 8) intersecting the word line structure may be formed on the word line structure. A circuit structure 3 including a transistor may be formed, and landing pads 5 electrically connected to the circuit structure 3 and a lower insulating layer 7 that is disposed on (covering) side surfaces of the landing pads 5 may be formed to prepare the lower structure 10.

Next, an etch stop layer ES may be conformally formed on the lower structure 10, and the mold layers 29*a* and 29*b* and the preliminary support layers S1' and S2' may be stacked alternately on the etch stop layer ES. The etch stop layer ES may include an insulating material having etch selectivity against the mold layers 29*a* and 29*b* under specific etch conditions, for example, at least one of silicon nitride (SiN) or silicon carbonitride (SiCN). In an example embodiment, the mold layers 29*a* and 29*b* and the preliminary support layers Si' and S2' may be formed as two layers, respectively, but the number of the preliminary support layers S1' and S2' is not limited thereto. For example, the mold layers 29*a* and 29*b* may include silicon oxide, and the preliminary support layers S1' and S2' may include silicon nitride. According to embodiments, the mold layers 29*a* and 29*b* may include different materials.

Next, a plurality of holes passing through the mold layers 29*a* and 29*b* and the preliminary support layers S1' and S2' may be formed, and a conductive material may be filled in the plurality of holes to form the plurality of lower electrodes LE. The plurality of holes may pass through the etch stop layer ES to expose the landing pads 5. The plurality of lower electrodes LE may be formed by filling the plurality of holes with the conductive material and performing a chemical mechanical polishing (CMP) process. The conductive material may be, for example, TiN.

Next, first and second masks M1 and M2 may be formed on an uppermost preliminary support layer (e.g., S2'). The second mask M2 may have a structure including a plurality of hole-shaped openings exposing a position corresponding to a region of a hole H of FIG. 1 or 6B or a position corresponding to a region including the same.

Figure 6B:
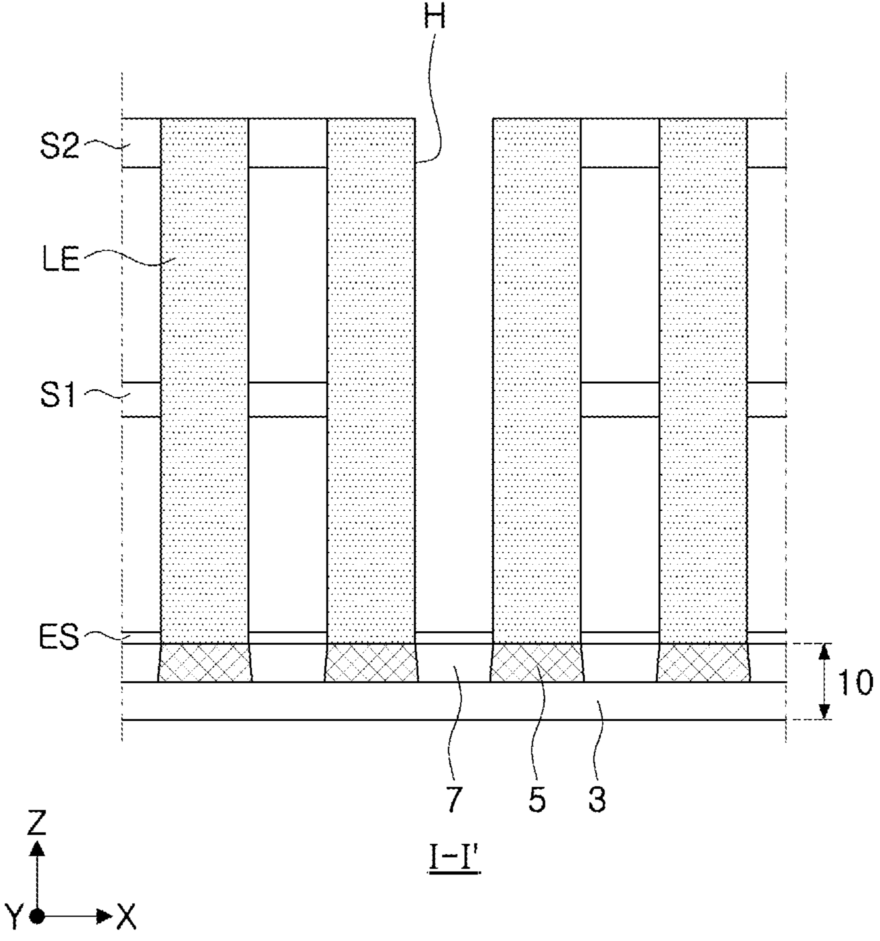

Referring to FIG. 6B, at least a portion of the mold layers 29*a* and 29*b* and at least a portion of the preliminary support layers Si' and S2' may be removed using the first and second masks M1 and M2 to form support layers S1 and S2, and remaining portions of the mold layers 29*a* and 29*b* may be removed.

The first and second masks M1 and M2 may be masks for forming the support layers S1 and S2. An etching process may be performed on portions of the mold layers 29*a* and 29*b* and portions of the preliminary support layers Si' and S2', not overlapping the second mask M2 in the Z direction, to form the support layers S1 and S2. Each of the support layers Si and S2 may be patterned, according to a structure of the second mask M2, to have a shape having a plurality of openings. In the etching process, at least a portion of an exposed upper surface of the plurality of lower electrodes LE may be etched together. The support layers Si and S2 may connect a plurality of adjacent lower electrodes LE. Remaining portions of the mold layers 29*a* and 29*b* may be selectively removed with respect to the support layers Si and S2. In an example embodiment, the second preliminary support layer S2' may be etched by an anisotropic etching process to form the second support layer S2, and the second mold layer 29*b* may be removed by an isotropic etching process, before etching the first preliminary support layer S1'. Similarly, after forming the first support layer S1 by etching the first preliminary support layer S1' using an anisotropic etching process, the first mold layer 29*a* may be removed by an isotropic etching process.

Figure 6C:
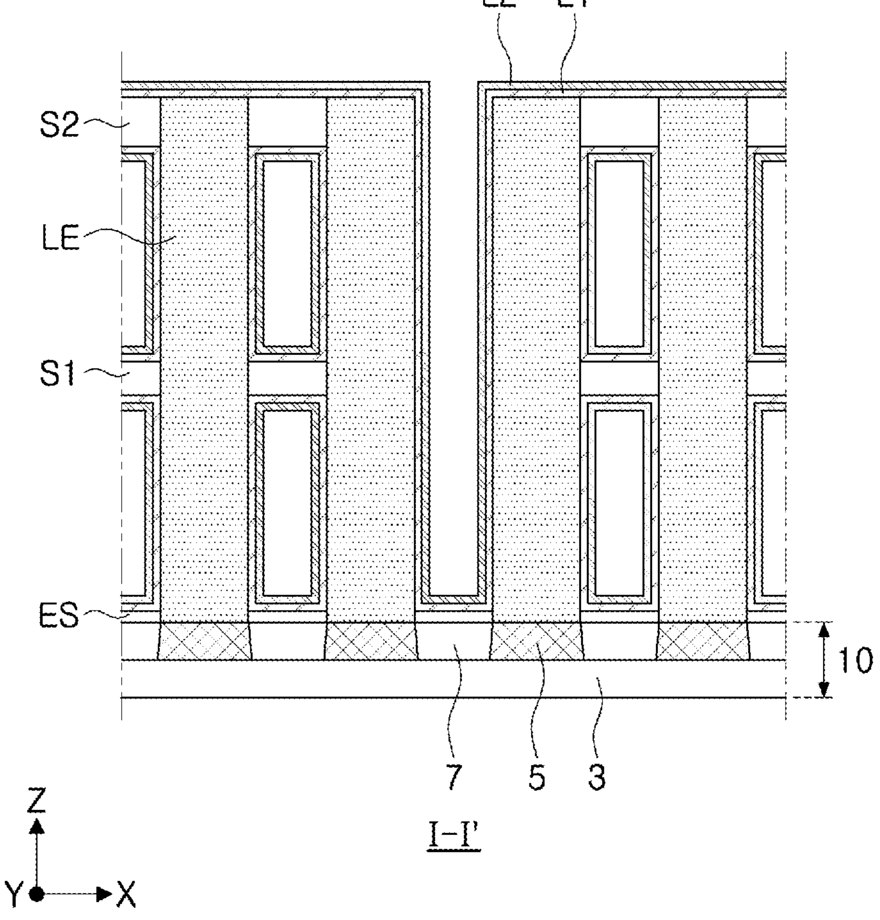

Referring to FIG. 6C, a first preliminary layer L1 and a second preliminary layer L2 may be sequentially deposited.

The first preliminary layer L1 conformally disposed on (covering) exposed surfaces of the etch stop layer ES, the support layers S1 and S2, and the plurality of lower electrodes LE may be deposited, and the second preliminary layer L2 may be deposited on the first preliminary layer L1. A deposition process may be performed using ALD, CVD, or PVD, and according to embodiments, the first and second preliminary layers L1 and L2 may be formed by performing an ion implantation process, instead of the deposition process.

The first preliminary layer L1 may be disposed on (cover) an upper surface of the etch stop layer ES and upper and lower surfaces of the support layers S1 and S2, together with side and upper surfaces of the plurality of lower electrodes LE. In an example embodiment, the first preliminary layer L1 may be a metal oxide layer including a first metal element and oxygen. The first metal element may be one of tin (Sn), molybdenum (Mo), niobium (Nb), tantalum (Ta), titanium (Ti), indium (In), nickel (Ni), cobalt (Co), tungsten (W), or ruthenium (Ru). The first metal element may be, for example, the same metal element as a main metal element of the plurality of lower electrodes LE, but the present inventive concept is not limited thereto.

The second preliminary layer L2 may be conformally disposed on (cover) the first preliminary layer L1. The second preliminary layer L2 may be a metal oxide layer including oxygen and a second metal element, different from the first metal element. The second metal element may be one of tin (Sn), molybdenum (Mo), niobium (Nb), tantalum (Ta), titanium (Ti), indium (In), nickel (Ni), cobalt (Co), tungsten (W), or ruthenium (Ru).

According to embodiments, a third preliminary layer may be additionally deposited on the second preliminary layer L2.

Figure 6D:
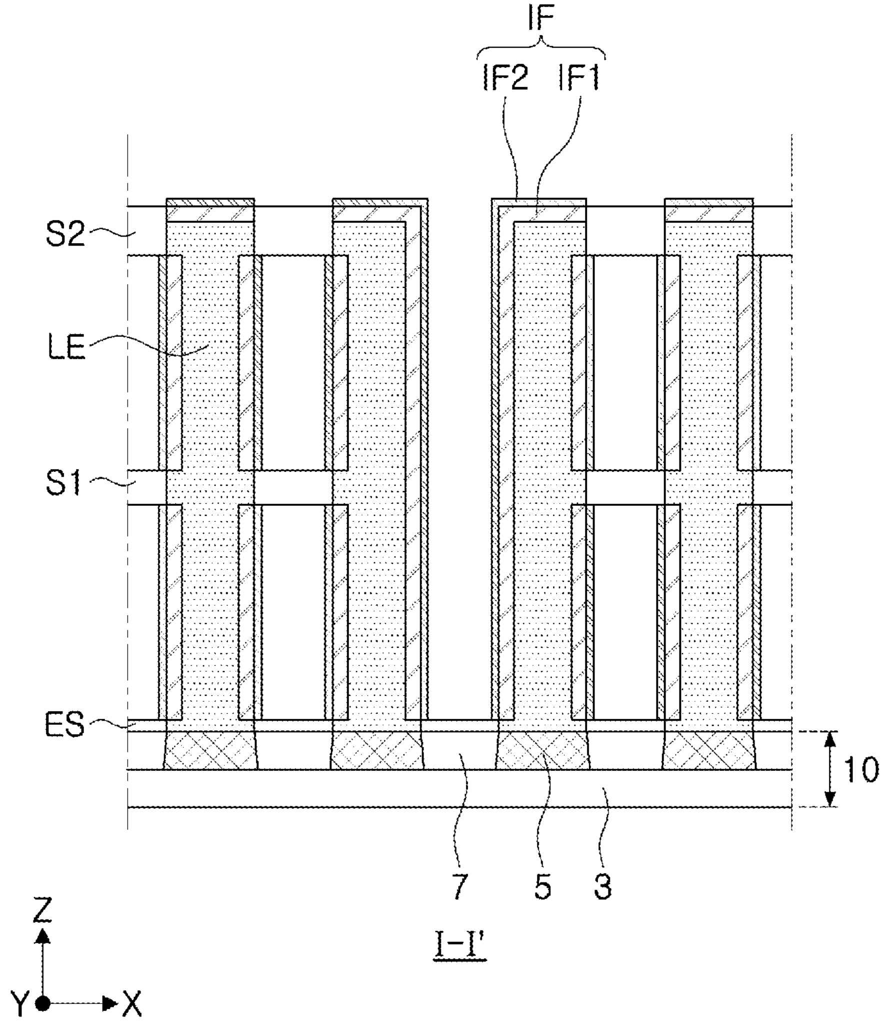

Referring to FIG. 6D, a plurality of interfacial layers IF including first and second layers IF1 and IF2 may be formed.

A heat treatment process may be performed on the first preliminary layer L1 and the second preliminary layer L2 to diffuse materials in the plurality of lower electrodes LE, the first preliminary layer L1, and the second preliminary layer L2, and a selective etching process may be then performed to form the plurality of interfacial layers IF.

According to embodiments, an energy source, other than the heat treatment process using thermal energy, may be used to diffuse the first metal element and the second metal element. The energy source may include, for example, at least one of electrical energy, ion energy, plasma, ozone, or UV, but not limited thereto.

Referring to FIGS. 6C and 6D, the first and second layers IF1 and IF2 may be formed by an ex-situ process in which energy is applied after sequentially depositing the first preliminary layer L1 and the second preliminary layer L2, or may be formed by an in-situ method in which energy is applied and diffused while the first preliminary layer L1 is deposited.

The selective etching process may be a process of removing dummy interfacial layers disposed on the upper surface of the etch stop layer ES or disposed on the upper and lower surfaces of the support layers S1 and S2. Therefore, a leakage current that may occur between the plurality of lower electrodes LE by the dummy interfacial layers may be prevented. In the selective etching process, as deposition and heat treatment processes using the first preliminary layer L1 and the second preliminary layer L2 are performed to form the plurality of interfacial layers IF and the dummy interfacial layers, the dummy interfacial layers may be relatively easily removed. This may be because an etching rate of the dummy interfacial layers formed by additional diffusion of the first metal element is higher, as compared to that of the second preliminary layer L2 including the second metal element. For example, by using an interfacial layer having a multilayer structure, the plurality of interfacial layers IF on the plurality of lower electrodes LE may remain, and the dummy interfacial layers on the upper and lower surfaces of the support layers S1 and S2 may be removed, to form a semiconductor device having improved electrical characteristics.

In this operation, a portion of the dummy interfacial layers may remain by the selective etching process to provide the semiconductor device 1*e* of FIG. 5E. Even in this case, since a concentration of the second metal element in the dummy interfacial layers is about 1/1000 to about 1/10000 or less of a concentration of the second metal element in the interfacial layers IF, a leakage current may be prevented.

Figure 6E:
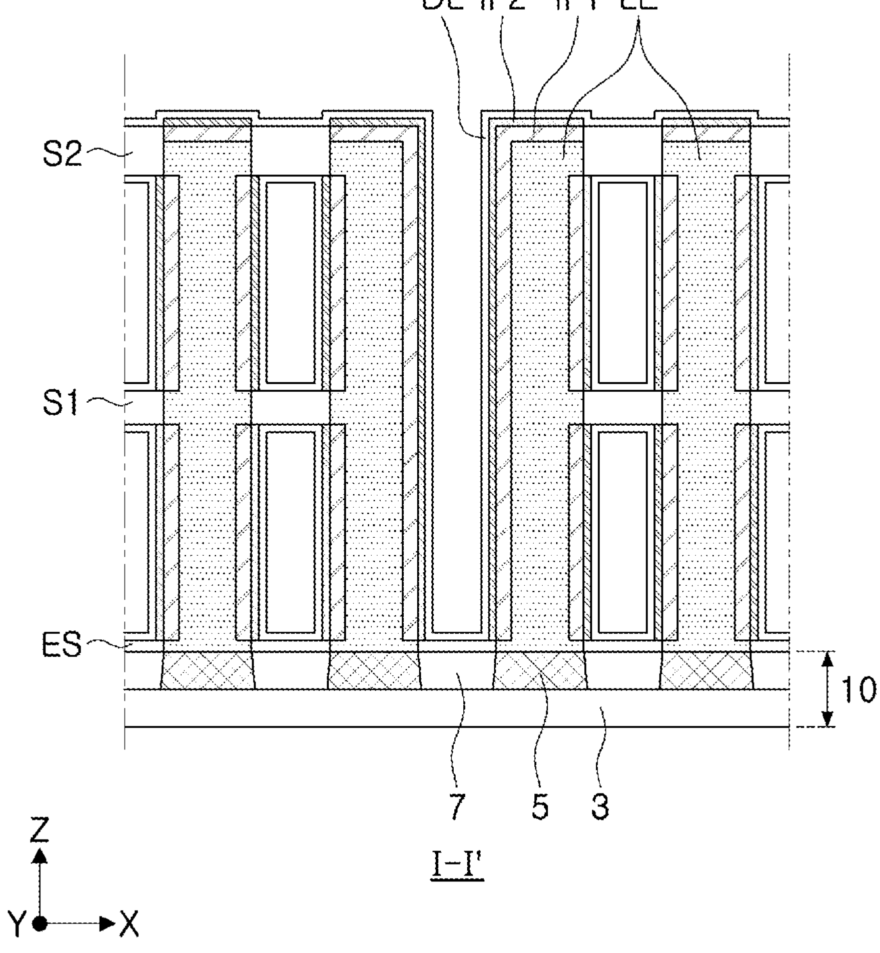

Referring to FIG. 6E, a dielectric layer DL may be formed.

The dielectric layer DL may be formed by depositing a dielectric material layer including a ferroelectric or antiferroelectric material. For example, the dielectric layer DL may be an oxide, a nitride, silicide, oxynitride, or silicified oxynitride containing at least one of hafnium (Hf), aluminum (Al), zirconium (Zr), or lanthanum (La). According to embodiments, the dielectric layer DL may be formed of a plurality of layers.

The dielectric layer DL including a ferroelectric or antiferroelectric material may provide a semiconductor device having improved electrical characteristics by reducing (minimizing) the occurrence of BD defects by a process using the first and second preliminary layers L1 and L2 having a multi-layer structure.

Next, referring to FIG. 2, the upper electrode UE may be formed by depositing a conductive material covering the dielectric layer DL and performing a patterning process. The conductive material may include at least one of a semiconductor material such as polycrystalline silicon doped with impurities, or the like, a metal nitride such as titanium nitride (TiN) or the like, or a metal material such as titanium (Ti), cobalt (Co), nickel (Ni), tungsten (W), molybdenum (Mo), or the like.

Figure 7:
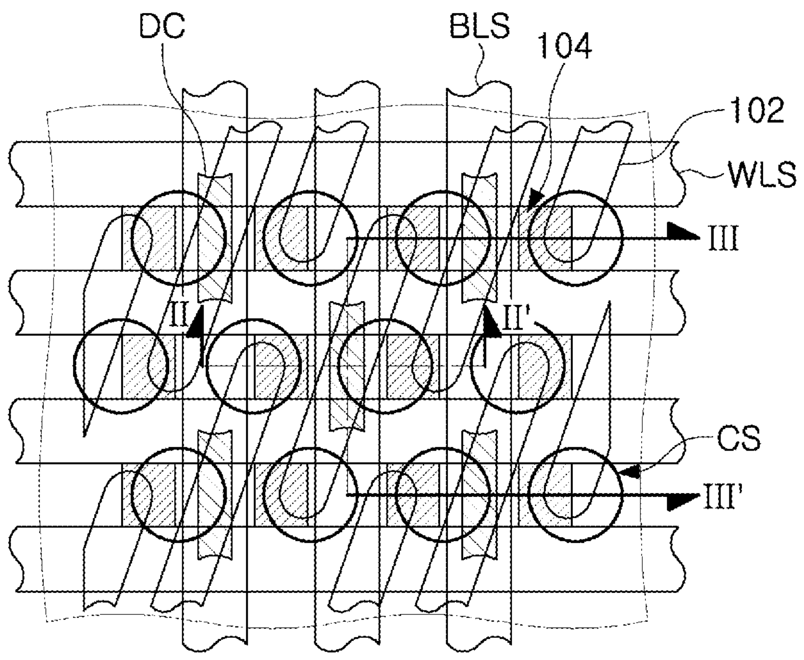
FIG. 7 is a schematic plan view of a semiconductor device according to example embodiments.
Figure 7:
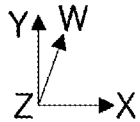

FIG. 7 is a schematic plan view of a semiconductor device according to example embodiments.

Figure 8:
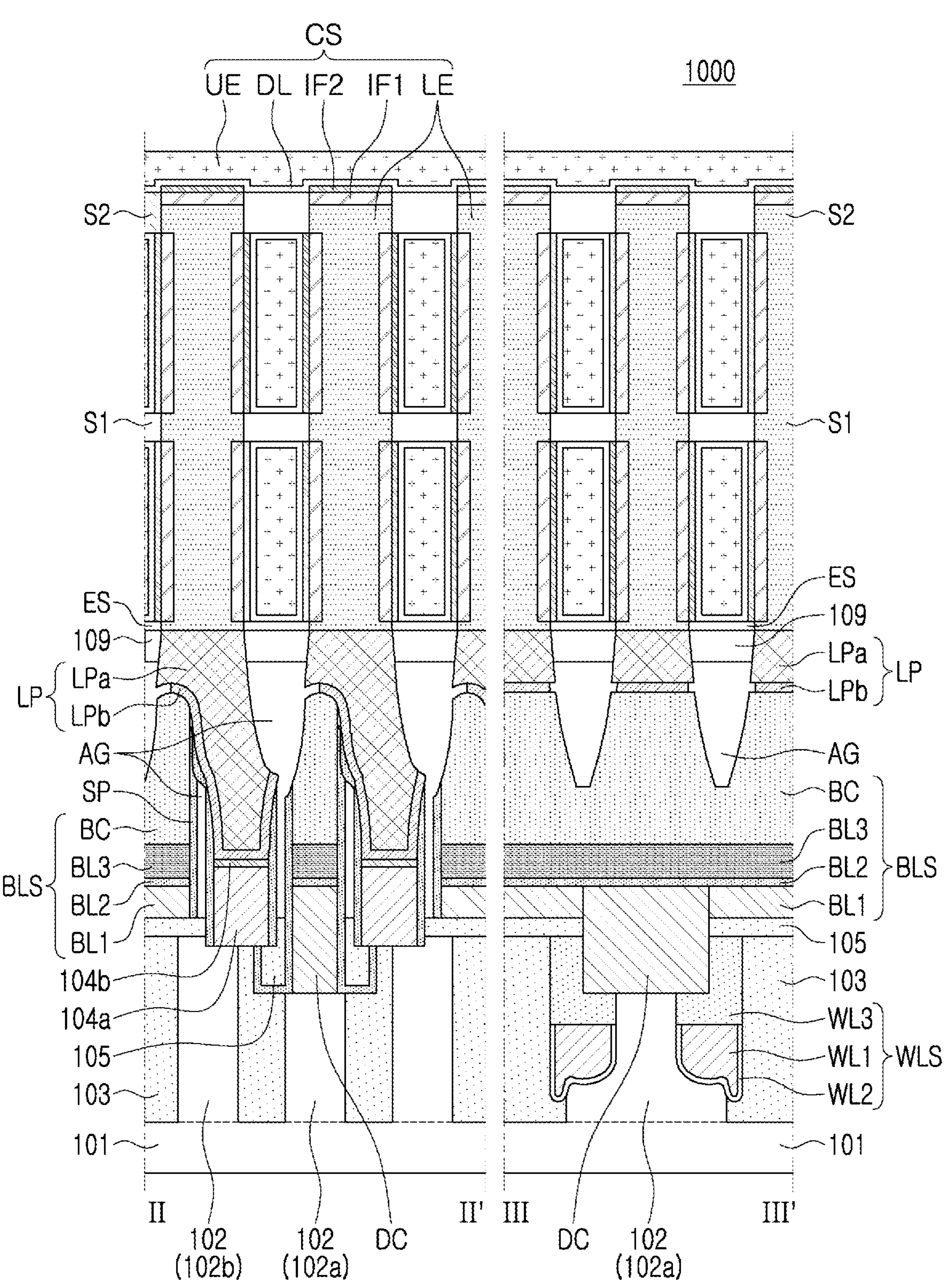
FIG. 8 is a schematic cross-sectional view of a semiconductor device according to example embodiments.

FIG. 8 is a schematic cross-sectional view of a semiconductor device according to example embodiments. FIG. 8 illustrates cross-sections of the semiconductor device of FIG. 7, taken along lines II-IF and Referring to FIGS. 7 and 8, a semiconductor device 1000 may include a substrate 101 including active regions 102, an device isolation region 103 defining the active regions 102 in the substrate 101, a word line structure WLS embedded in the substrate 101 and extending, and including a word line WL1, a bit line structure BLS intersecting the word line structure WLS on the substrate 101 and extending, and including bit lines BL1, BL2, and BL3, and a capacitor structure CS disposed on the bit line structure BLS.

The semiconductor device 1000 may include, for example, a cell array of a dynamic random access memory (DRAM). For example, a bit line BL (e.g., BL1, BL2, or BL3) may be electrically connected to a first impurity region 102*a* of the active regions 102, the capacitor structure CS may be electrically connected to a second impurity region 102*b* of the active regions 102, and data may be stored in the capacitor structure CS. Since the capacitor structure CS has the same or similar characteristics as the capacitor structure CS of FIG. 2, an overlapping description will be omitted.

The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may further include impurities. The substrate 101 may be a silicon substrate, a silicon-on-insulator (SOI) substrate, a germanium substrate, a germanium-on-insulator (GOI) substrate, a silicon-germanium substrate, or a substrate including an epitaxial layer.

The active regions 102 may be defined in the substrate 101 by the device isolation region 103. The active region 102 may have a bar shape, and may be disposed in the substrate 101 in an island shape extending in one direction, for example, a W direction. The active regions 102 may have the first and second impurity regions 102*a* and 102*b* having a predetermined depth from an upper surface of the substrate 101. The first and second impurity regions 102*a* and 102*b* may be spaced apart from each other. The first and second impurity regions 102*a* and 102*b* may serve as source/drain regions of a transistor formed by the word line WL1. In example embodiments, depths of the first and second impurity regions 102*a* and 120*b* in the source region and the drain region may be different from each other.

The device isolation region 103 may be formed by a shallow trench isolation (STI) process. The device isolation region 103 may surround the active regions 102 and electrically isolate the active regions 102 from each other. The device isolation region 103 may be formed of an insulating material, for example, silicon oxide, silicon nitride, or a combination thereof. The device isolation region 103 may include a plurality of regions having different lower end depths according to a width of a trench from which the substrate 101 is etched.

The word line structure WLS may include a word line WL1, a gate dielectric layer WL2, and a gate capping layer WL3. The word line WL1 may be disposed to cross the active regions 102 and extend in a first horizontal direction X. For example, a pair of adjacent word lines WL1 may be disposed to cross one active region 102. The word line WL1 may constitute a gate of a buried channel array transistor (BCAT), but the present inventive concept is not limited thereto. According to embodiments, the word line WL1 may have a shape disposed on the upper surface of the substrate 101. The word line WL1 may include a conductive material, for example, at least one of polycrystalline silicon (Si), titanium (Ti), titanium nitride (TiN), tantalum (Ta), tantalum nitride (TaN), tungsten (W), tungsten nitride (WN), or aluminum (Al). According to embodiments, the word line WL1 may have a multi-layer structure formed of different materials.

The gate dielectric layer WL2 may be conformally disposed on (cover) side and bottom surfaces of the word line WL1. The gate dielectric layer WL2 may include at least one of silicon oxide, silicon nitride, or silicon oxynitride. The gate dielectric layer WL2 may be, for example, a silicon oxide layer, or an insulating layer having a high dielectric constant.

The gate capping layer WL3 may be disposed on the word line WL1. The gate capping layer WL3 may be formed of an insulating material, for example, silicon nitride.

The bit line structure BLS may extend in a second horizontal direction, perpendicular to the word line WL1, for example, a Y direction. The bit line structure BLS may include a bit lines BL1, BL2, and BL3 and a bit line capping pattern BC on the bit lines BL1, BL2, and BL3.

The bit lines BL1, BL2, and BL3 may include a first conductive pattern BL1, a second conductive pattern BL2, and a third conductive pattern BL3, sequentially stacked. The first conductive pattern BL1 may include a semiconductor material such as polycrystalline silicon. The second conductive pattern BL2 may include a metal-semiconductor compound. The third conductive pattern BL3 may include a metal material such as titanium (Ti), tantalum (Ta), tungsten (W), or aluminum (Al). According to embodiments, the number and thicknesses of conductive patterns constituting a bit line may be variously changed.

The bit line capping pattern BC may be disposed on the bit lines BL1, BL2, and BL3. The bit line capping pattern BC may include an insulating material, for example, a silicon nitride layer. According to embodiments, the bit line capping pattern BC may include a plurality of capping pattern layers, and may be formed of different materials. For example, the number of capping patterns and/or a type of a material constituting the bit line capping pattern BC may be variously changed according to embodiments.

In an example embodiment, the bit line structure BLS may be disposed on the word line structure WLS, and a buffer insulating layer 105 may be disposed between the bit line structure BLS and the word line structure WLS.

In an example embodiment, the semiconductor device 1000 may further include a bit line contact pattern DC passing through the first conductive pattern BL1 to contact the first impurity region 102*a* of the active regions 102. The bit line contact pattern DC may be electrically connected to the bit line structure BLS. A lower surface of the bit line contact pattern DC may be located on a higher level than an upper surface of the word line WL1. According to embodiments, the bit line contact pattern DC may be integrally formed with the first conductive pattern BL1.

In an example embodiment, the semiconductor device 1000 may further include a lower electrode contact pattern 104, landing pads LP, and a lower insulating layer 109.

The lower electrode contact pattern 104 may be connected to one region of the active regions 102, for example, the second impurity region 102*b*. The lower electrode contact pattern 104 may be disposed between the bit lines BL1, BL2, and BL3 and between the word lines WL1. A lower surface of the lower electrode contact pattern 104 may be located on a lower level than the upper surface of the substrate 101, and may be located on a higher level than the lower surface of the bit line contact pattern DC. The lower electrode contact pattern 104 may be insulated from the bit line contact pattern DC by a spacer SP. The spacer SP may include an insulating material such as silicon oxide, silicon nitride, or the like, and may define an air gap AG to serve as a spacer together with the air gap AG. A material constituting the spacer SP and the number of layers constituting the spacer SP are not limited thereto, and may be variously changed. The lower electrode contact pattern 104 may be formed of a conductive material, and may include, for example, at least one of polycrystalline silicon (Si), titanium (Ti), titanium nitride (TiN), tantalum (Ta), tantalum nitride (TaN), tungsten (W), tungsten nitride (WN), or aluminum (Al). In an example embodiment, in the lower electrode contact pattern 104, a semiconductor layer 104*a* and a metal-semiconductor compound layer 104*b* on the semiconductor layer 104*a* may be disposed. The metal-semiconductor compound layer 104*b* may be a layer in which a portion of the semiconductor layer 104*a* is silicided, and may include, for example, cobalt silicide (CoSi), titanium silicide (TiSi), nickel silicide (NiSi), tungsten silicide (WSi), or other metal silicides. According to embodiments, the number and materials of the layers forming the lower electrode contact pattern 104 may be variously changed.

The landing pads LP may be conductive patterns disposed on the lower electrode contact pattern 104. The landing pads LP may electrically connect the plurality of lower electrodes LE and the lower electrode contact pattern 104. The landing pads LP may be physically spaced apart from each other by the lower insulating layer 109.

In an example embodiment, each of the landing pads LP may include a pad layer LPa and a barrier layer LPb. The pad layer LPa may include a conductive material, for example, at least one of polycrystalline silicon (Si), titanium (Ti), tantalum (Ta), tungsten (W), ruthenium (Ru), copper (Cu), molybdenum (Mo), platinum (Pt), nickel (Ni), cobalt (Co), aluminum (Al), titanium nitride (TiN), tantalum nitride (TaN), or tungsten nitride (WN). The barrier layer LPb may include a metal nitride covering lower and side surfaces of the pad layer LPa, for example, at least one of titanium nitride (TiN), tantalum nitride (TaN), or tungsten nitride (WN).

According to embodiments of the present inventive concept, a semiconductor device having improved electrical characteristics such as a reduction in leakage current, an increase in capacitance, or the like by forming a plurality of interfacial layers between a lower electrode and a dielectric layer using a ferroelectric in a capacitor structure may be provided.

Various advantages and effects of the present inventive concept are not limited to the above, and will be more easily understood in the process of describing specific embodiments of the present inventive concept.

While example embodiments have been illustrated and described above, it will be apparent to those skilled in the art that modifications and variations could be made without departing from the scope of the present inventive concept as defined by the appended claims.

Herein, a lower side, a lower portion, a lower surface, and the like, are used to refer to a direction toward a lower structure or a substrate in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an intermediate layer as well as a direct connection between two components with or without intervening layers or components. In addition, "electrically connected" conceptually includes a physical connection and a physical disconnection. It can be understood that when an element is referred to with terms such as "first" and "second", the element is not limited thereby. They may be used only for a purpose of distinguishing an element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

What is claimed is:

1. A semiconductor device comprising:

a lower structure;

a plurality of lower electrodes on the lower structure;

an upper electrode on the plurality of lower electrodes;

a dielectric layer between the plurality of lower electrodes and the upper electrode, and including a ferroelectric layer or an antiferroelectric layer; and a plurality of interfacial layers between the plurality of lower electrodes and the dielectric layer, wherein the plurality of interfacial layers includes:

a first layer contacting the plurality of lower electrodes, and including a first metal element, a second metal element, different from the first metal element, and elemental nitrogen; and a second layer between the first layer and the dielectric layer, and including the first metal element, the second metal element, and elemental oxygen, and wherein a concentration of the second metal element in the first layer is lower than a concentration of the second metal element in the second layer.

2. The semiconductor device of claim 1, wherein a concentration of the first metal element in the first layer is higher than a concentration of the first metal element in the second layer.

3. The semiconductor device of claim 1, wherein a first thickness of the first layer is greater than a second thickness of the second layer.

4. The semiconductor device of claim 3, wherein the first thickness is in a range from about 1 angstrom (Å) to 20 angstroms (Å), and the second thickness is in a range from about 1 angstrom (Å) to 10 angstroms (Å).

5. The semiconductor device of claim 1, further comprising a support layer contacting the plurality of lower electrodes and extending in a direction, parallel to an upper surface of the lower structure, wherein upper and lower surfaces of the support layer are in contact with the dielectric layer.

6. The semiconductor device of claim 5, wherein the first layer is free of having an overlap with the support layer in a vertical direction perpendicular to the upper surface of the lower structure, and the second layer overlaps the support layer in the vertical direction.

7. The semiconductor device of claim 5, wherein the first layer extends on a side surface of the second layer and a portion of a side surface of the support layer.

8. The semiconductor device of claim 5, wherein the second layer comprises a portion having a narrower width than other portions of the second layer toward the support layer.

9. The semiconductor device of claim 5, wherein the first layer includes a convex shape portion in a direction from the second layer toward the plurality of lower electrodes, and the second layer comprises a convex shape portion in a direction from the first layer toward the dielectric layer.

10. The semiconductor device of claim 5, wherein the plurality of interfacial layers further comprise a third layer disposed between the first layer and the second layer, wherein the third layer comprises the first metal element, the second metal element, elemental nitrogen, and elemental oxygen.

11. The semiconductor device of claim 10, wherein, in a vertical direction perpendicular to the upper surface of the lower structure, a portion of the third layer overlaps the support layer.

12. The semiconductor device of claim 1, further comprising:

a support layer contacting the plurality of lower electrodes and extending in a direction, parallel to an upper surface of the lower structure; and a dummy interfacial layer between the support layer and the dielectric layer, wherein the dummy interfacial layer includes the second metal element, and a ratio of an amount of the second metal element per unit in the plurality of interfacial layers relative to an amount of the second metal element per unit in the dummy interfacial layer is about 1000 to about 10000.

* * * * *